(12) United States Patent
Manini et al.

(10) Patent No.: US 8,399,861 B2
(45) Date of Patent: Mar. 19, 2013

(54) LITHOGRAPHY APPARATUS USING EXTREME UV RADIATION AND HAVING A VOLATILE ORGANIC COMPOUNDS SORBING MEMBER COMPRISING A GETTER MATERIAL

(75) Inventors: Paolo Manini, Milan (IT); Andrea Conte, Milan (IT)

(73) Assignee: Saes Getters S.p.A., Lainate (MI) (IT)

( * ) Notice: Subject to any disclaimer, the term of this patent is extended or adjusted under 35 U.S.C. 154(b) by 107 days.

(21) Appl. No.: 12/812,948

(22) PCT Filed: Feb. 10, 2009

(86) PCT No.: PCT/EP2009/051516
§ 371 (c)(1),
(2), (4) Date: Jul. 14, 2010

(87) PCT Pub. No.: WO2009/103631
PCT Pub. Date: Aug. 27, 2009

(65) Prior Publication Data
US 2010/0309446 A1 Dec. 9, 2010

(30) Foreign Application Priority Data

Feb. 22, 2008 (IT) .............................. MI2008A0282

(51) Int. Cl.
*C23C 14/56* (2006.01)
*G03B 27/52* (2006.01)
(52) U.S. Cl. ..................... 250/492.2; 250/492.1; 355/30
(58) Field of Classification Search .... 250/492.1–492.2; 355/30
See application file for complete search history.

(56) References Cited

U.S. PATENT DOCUMENTS

| 4,969,556 | A | * | 11/1990 | Ishimaru et al. | 206/524.8 |
| 5,772,404 | A | * | 6/1998 | Carella et al. | 417/51 |
| 5,911,560 | A | * | 6/1999 | Krueger et al. | 417/48 |
| 2005/0122491 | A1 | | 6/2005 | Bakker et al. | 355/30 |
| 2005/0229783 | A1 | * | 10/2005 | Alvarez et al. | 95/117 |
| 2006/0175558 | A1 | * | 8/2006 | Bakker et al. | 250/492.2 |
| 2007/0023709 | A1 | | 2/2007 | Kanazawa et al. | 250/504 R |
| 2008/0011967 | A1 | * | 1/2008 | Van Herpen et al. | 250/492.2 |
| 2008/0050680 | A1 | * | 2/2008 | Brandl | 430/394 |
| 2008/0143981 | A1 | | 6/2008 | Ehm et al. | 355/30 |

FOREIGN PATENT DOCUMENTS

| CN | 1174593 A | 2/1998 |
| CN | 1215799 A | 5/1999 |
| CN | 1989458 A | 6/2007 |
| DE | 102006036488 | 2/2008 |
| EP | 0910106 | 4/1999 |
| EP | 0910106 A1 * | 4/1999 |
| JP | 2004-053264 | 9/2005 |

(Continued)

OTHER PUBLICATIONS

International Search Report for PCT/EP2009/051516 filed on Feb. 10, 2009 in the name of SAES Getters S.P.A.

(Continued)

*Primary Examiner* — Robert Kim
*Assistant Examiner* — David E Smith
(74) *Attorney, Agent, or Firm* — Steinfl & Bruno, LLP

(57) ABSTRACT

A lithography apparatus (10) is disclosed using extreme UV radiation and having a hydrocarbon sorbing member comprising a getter material arranged in the process chamber (13) of said apparatus.

21 Claims, 4 Drawing Sheets

FOREIGN PATENT DOCUMENTS

| WO | WO 96/17171 A2 | 6/1996 |
|----|----|----|
| WO | 2004/104707 | 12/2004 |
| WO | 2006/011105 | 2/2006 |
| WO | WO 2006011105 A2 * | 2/2006 |
| WO | 2008/034582 | 3/2008 |
| WO | 2009/002531 | 12/2008 |

OTHER PUBLICATIONS

Written Opinion for PCT/EP2009/051516 filed on Feb. 10, 2009 in the name of SAES Getters S.P.A.

International Preliminary Report on Patentability for PCT/EP2009/051516 filed on Feb. 10, 2009 in the name of SAES Getters S.P.A.

Conte, A., et al. NEG (Non Evaporable Getter) pumps for organic compounds and water removal in EUVL tools. Proc. of the SPIE-International Society for Optical Engineering, vol. 6921, No. 4, pp. 692138-1-692138-9, Mar. 14, 2008.

First Office Action for Chinese Application for Invention No. 200980103842.7 filed in the name of SAES Getters S.p.A. Mail date: Jan. 1, 2012.

Notice of Reasons for Rejection for Japanese Application No. JP 2010-547146 filed in the name of SAES Getters S.p.A. Mail date: Nov. 13, 2012.

* cited by examiner

LITHOGRAPHY APPARATUS USING EXTREME UV RADIATION AND HAVING A VOLATILE ORGANIC COMPOUNDS SORBING MEMBER COMPRISING A GETTER MATERIAL

CROSS REFERENCE TO RELATED APPLICATIONS

The present application is the US national stage of International Application PCT/EP2009/051516 filed on Feb. 10, 2009 which, in turn, claims priority to Italian Application MI2008A000282, filed on Feb. 22, 2008.

The present invention refers to a lithography apparatus using extreme UV radiation and having a Volatile Organic Compounds (VOCs) sorbing member comprising a getter material.

Lithography is a technique used in the manufacturing of integrated circuits to define the geometry of the parts that form these circuits; the technique is also used in other similar manufacturing processes, such as those of micromechanical systems (known in the field as MEMS). In order to illustrate the invention, reference will be made in the text to the manufacturing of integrated circuits (known as ICs,), but the invention can be employed in all the manufacturing processes using the lithography technique.

In the manufacturing of ICs, a film of a polymeric material, that shows the characteristic of being able to change its chemical behaviour (for example its solubility in a given solvent) upon the exposure to a radiation at a given wavelength, is positioned, or formed starting from liquid precursors, onto a slice of a supporting material, typically silicon or other semiconductor materials. By selectively illuminating with the suitable radiation only portions of the polymeric film, this is locally sensitized in such a way to make it subsequently attackable by a solvent (also the contrary is possible, i.e. that the film as such is attackable by the solvent and the radiation treatment makes it instead resistant thereto). After the selective illumination treatment, the portions rendered sensitive to the chemical attack of the solvent (or remained sensitive) are removed by a treatment with the latter, exposing only the desired portions of the supporting surface; on these portions it is then possible to form localized deposits of materials having desired characteristics, such as for example conducting or insulating materials, by techniques such as physical vapour deposition (PVD, a technique more commonly known in the field as "sputtering"), chemical vapour deposition (CVD), Molecular Beam Epitaxy (MBE) or the like; alternatively, the exposed portions of the supporting surface may undergo an erosive treatment in order to form recesses of suitable geometry in the surface of the support itself, for example by chemical attacks. By alternating subsequent cycles of positioning or depositing of the polymeric film, selectively removing of its portions and depositing "traces" of desired materials on the exposed portions of the support or erosion thereof, the desired structures of the integrated circuit are finally manufactured.

In order to reduce the manufacturing costs and to follow the demand of the market for more and more compact electronic products, the typical dimensions of the parts that form integrated circuits undergo a constant reduction over time; at present the smallest dimension of IC parts that are obtained through lithographic techniques are about 100 nanometers (nm), but a transition to the next generation of ICs is already in progress, in which the smallest dimensions of IC parts will be around 30 nm.

In order to be able to define smaller and smaller geometries and structures, during the lithographic operations it is necessary to use radiations of smaller wavelengths, comparable to the dimensions of these geometries. The main manufacturers of ICs have defined a new wavelength standard to be used for the manufacturing of ICs of the next generation, which is around 13.5 nm. This value is in the range of UV radiations of shorter wavelength, defined in the field as extreme UV (or EUV): Lithography that uses these radiations is consequently known in the field under the definition "Extreme UV Lithography", or under its abbreviation EUVL.

The lithographic techniques employed up to now used wavelengths to which some gases, liquids or solids were transparent; it was thus possible, by suitably choosing the materials that formed the lithographic system, to obtain that the optical path of the UV radiation from the source to the polymeric film occurred in a gaseous medium (for example, purified air) and that the deviation and focusing of the radiation occurred essentially only by refraction through suitable lenses. By employing EUVL this is no longer possible, because the EUV wavelengths are almost completely sorbed by all materials. Consequently, in EUVL the optical path of the radiation can be defined only inside evacuated chambers and by using reflecting elements (mirrors, monochromators, . . . ).

EUVL apparatuses currently under development are comprised of various main chambers, connected to each other only through small openings for the passage of the radiation from one chamber to another. Normally, the EUV radiation source (in general a plasma generated by a laser or an electric discharge) and a collector, that collects a portion of the radiation emitted by the source and directs the radiation along a preferred direction, are arranged in a first chamber. In an intermediate chamber there is a part of the elements for focusing and directing the beam exiting from the first chamber (for example, a monochromator and system of reflecting elements to direct the radiation from the monochromator). Finally, in a last chamber, defined "process chamber" in the following, there are the final reflecting elements for focusing the radiation onto the support, preferably made of semiconductor material that holds the polymeric film to be treated by the radiation, and a sample holder on which said support is fixed, being able to move freely and in a controlled manner in a plane perpendicular to the incident direction of the radiation (sample holders known as "X-Y tables"). Pumping systems are connected to the apparatus in order to maintain the required vacuum degree inside it, generally comprising turbo-molecular or cryogenic pumps. The required vacuum degree is different in the various chambers, and is less severe in the first chamber, up to requiring values of residual pressure lower than $10^{-7}$ Pa in the process chamber. An example of an EUVL apparatus is disclosed in the patent application US 2006/0175558 A1, which is referred to for a more detailed explanation of the various parts of a similar apparatus and of their functions.

A problem with EUVL apparatuses is the presence of volatile organic molecules in the process chamber. These molecules, when irradiated by the highly energetic UV radiation, can mutually react or react with the surface of the support, preferably made of semiconductor material, thus resulting in new species or in carbon residuals, resistant to the subsequent chemical treatments, that may remain incorporated in the structures under formation and cause defects thereof, thus resulting in manufacturing waste. Decomposition of the organic molecules and deposition of carbon-based layers can also take place on the optical lenses present in the process chamber which have the task to reflect the radiation coming from the EUV source. The presence of carbon layers on the surface of the lenses reduces their optical reflectivity, thus decreasing the radiation intensity reaching the substrate. This in turn decreases the photolithographic efficiency and the overall process yield.

Hydrocarbons are among the most common VOCs contaminants that may be present within the EUVL apparatuses.

EUVL apparatuses are normally equipped with various pumping units in order to maintain the chambers under high vacuum, but the scanning of the radiation across the surface of the polymeric film on the support is a source of organic molecules, both coming from the decomposition of the polymer and from solvent molecules trapped therein. These molecules are thus formed and released in the most critical zone of the system.

The pumping systems normally provided for maintaining the vacuum in EUVL apparatuses can not remove these species in a fast and effective way, before these can result in undesired reactions on or with the support, because these systems are normally positioned at far away from the support, which is also the zone wherein organic molecules are generated. In EUVL apparatuses it is not possible to bring the already present pumps closer to this zone, because the turbomolecular pumps would transmit vibrations to the reflecting elements or to the X-Y table, thus jeopardizing the scanning precision, whereas the cryogenic pumps would cause mechanical deformations in the system due to the high thermal gradients they generate, thus also resulting in this case in scanning imprecisions.

US 2006/011105 discloses cleaning solutions and their arrangement for the EUV optics, by means of getter deposits placed in the vicinity of the optical elements, while US 2005/0122491 discloses the use of a contamination trap interposed between the UV light source, nearby the same, and the element to be exposed, with the LTV light passing through the trap. Another approach to avoid optics contamination is disclosed in US 2005/0229783 and US 2007/0023709, providing for the use of getter purifiers for the purge gas within the lithographic apparatus, rather than means to block the contamination coming from elements inside the EUV apparatus Object of the present invention is thus to provide a lithography apparatus using extreme UV radiation capable of solving or anyway minimizing the problem of the presence of inorganic volatile molecules in the process chamber.

According to the present invention, this object is obtained by means of a lithography apparatus using extreme UV radiation, characterized by having a VOC sorbing member comprising a getter element inside the process chamber or in a suitable space connected thereto.

The inventors have found that getter materials, normally used in vacuum technology at operating temperatures of 200-300° C. for sorbing simple gaseous species as $H_2$, $O_2$, $H_2O$, CO and $CO_2$, can effectively sorb VOCs, with particular and non-exclusive reference to hydrocarbons at room temperature. This makes the elements containing getter materials (these being bodies either formed of getter materials only or being deposits of these materials on surfaces, or real structured getter pumps) particularly suitable for the use proximate to the support in the process chamber of an EUVL system. As it is known in fact getter materials enable to manufacture gas sorbing members that have no moving parts and thus are free from vibrations, and the finding of the VOCs sorbing capacity at room temperature leads to the fact that these materials can be positioned very close to the support on which the polymeric film is arranged, i.e. the source of the volatile organic molecules, without altering the thermal balance of the system and thus without introducing scanning imprecisions of the UV radiation across the polymeric film.

The invention will be illustrated in the following with reference to the annexed drawings, wherein.

Figure 4:
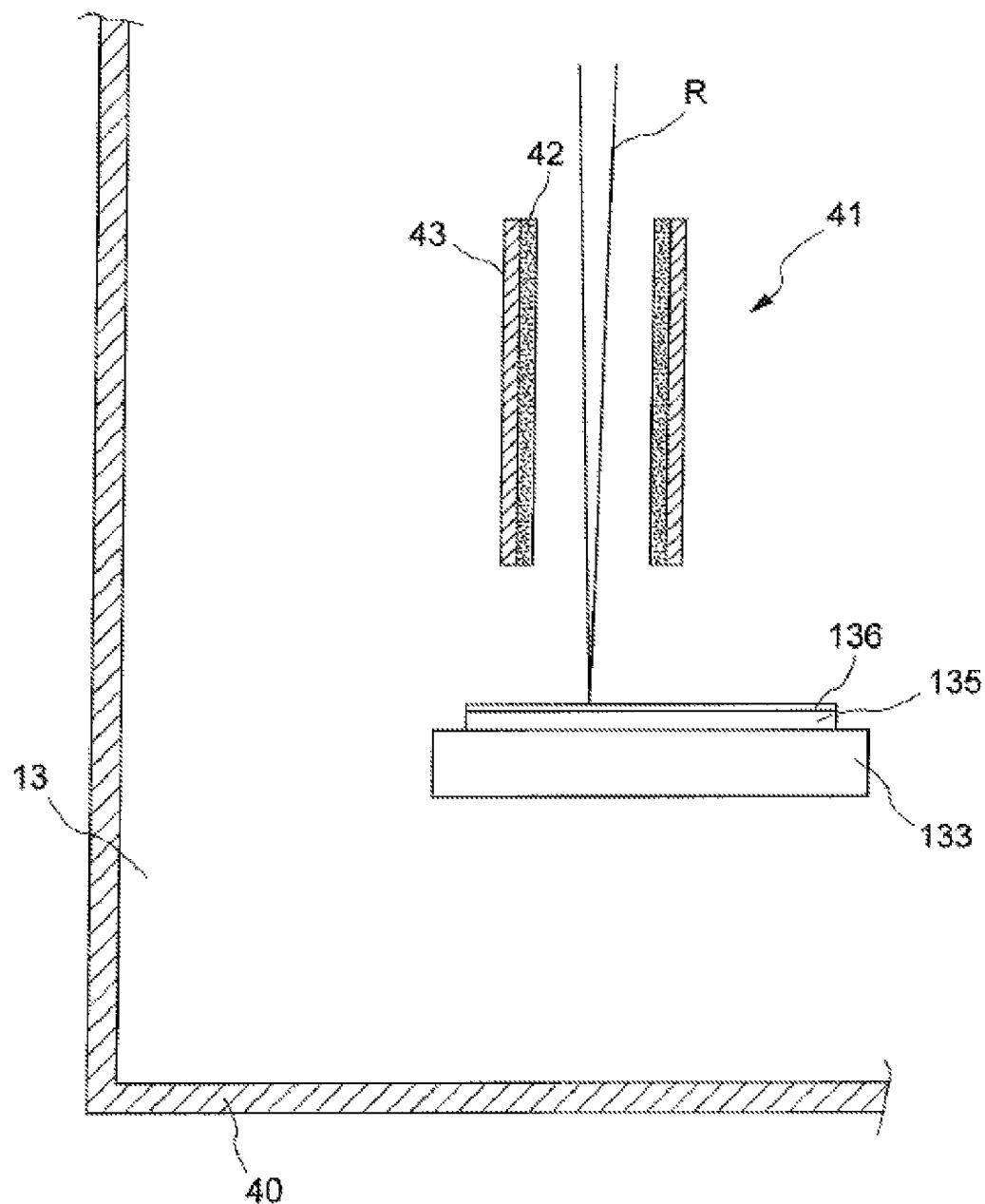
FIG. 4 shows a further possibility of positioning a getter member in the process chamber of an EUVL apparatus.

The dimensions of the elements and members shown in the drawings are not in scale, and in particular the thicknesses of some of those, such as the support, preferably made of semiconductor material, the polymeric film or the getter deposit shown in FIG. 4, have been largely increased to help to understand the drawings.

Moreover in the following reference will be made to the support as made of a semiconductor material, but this is only the preferred embodiment for carrying out the invention, and there may be cases in which devices may require a different type of material for the support, for example an insulating or non conducing material.

Figure 1:
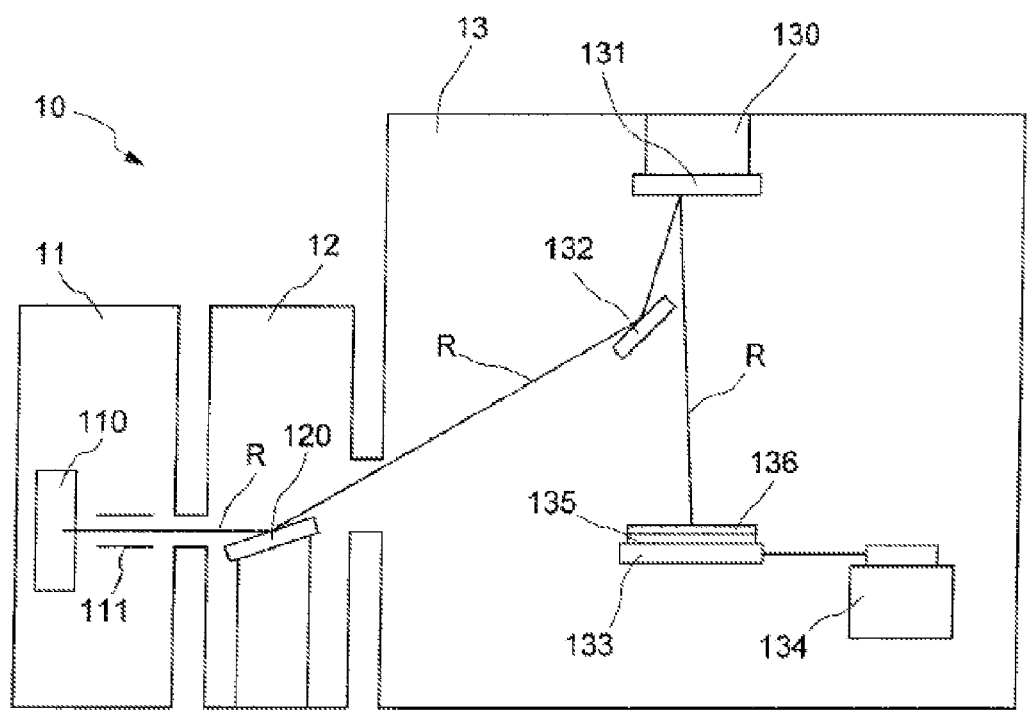
FIG. 1 shows the general geometry of an EUVL apparatus.

FIG. 1 shows an EUVL apparatus in a schematic and extremely simplified way. The apparatus 10 comprises a first chamber 11, in which the EUV radiation source 110 and a collector 111 are present, the latter collecting parts of the radiation emitted from the source in all directions and directs the radiation to the subsequent chamber; a second chamber 12, containing a monochromator 120 that selects the desired wavelength from the band of frequencies emitted from the source and directs the monochromatic radiation to the subsequent chamber; and a process chamber 13, containing a sample holder 130 that holds a mask 131 with the design to be reproduced on the polymeric film arranged on the support made of semiconductor material, at least one reflecting element 132 (but, in general a plurality of reflecting elements are provided, see for example FIG. 2 of patent application US 2006/0175558 A1), and an "X-Y" table 133 moved by a motorized member 134. On table 133 a support 135 made of a semiconductor material is arranged, on which a polymeric film 136 to be sensitized by the radiation is present; letter R in FIG. 1 indicates the path of the EUV radiation.

According to the invention, a getter member is arranged in the process chamber, in the area closest to the source of organic molecules.

Figure 2:
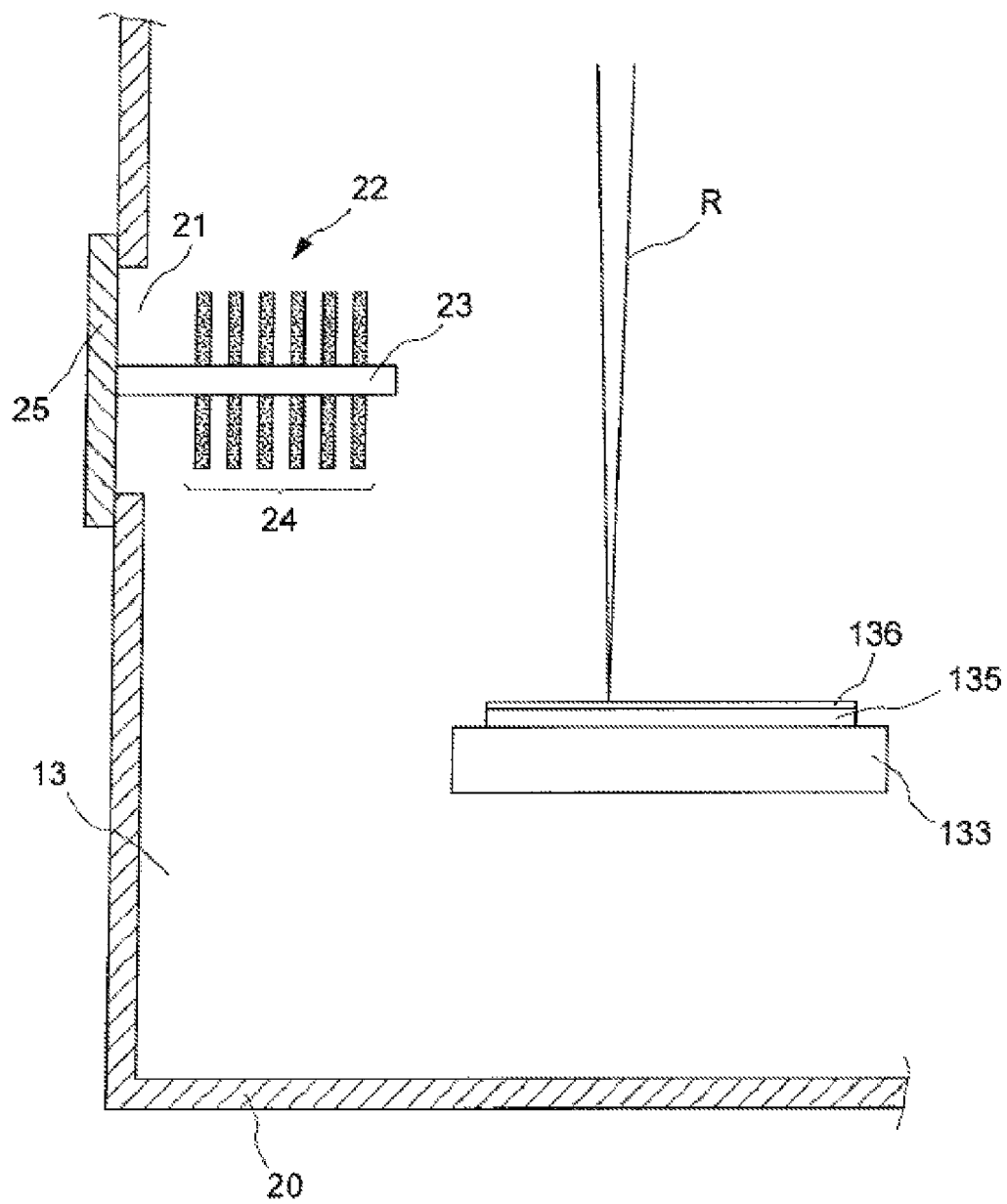
FIG. 2 shows a first possibility of positioning a getter member in the process chamber of an EUVL apparatus.

FIG. 2 shows a first possible way to introduce a getter member in the process chamber. In this case the member is a true getter pump. The drawing shows in a broken view and schematically a part of the process chamber 13, defined by a wall 20. In the wall an opening 21 for connecting a getter pump 22 to the chamber is provided, the pump being e.g. comprised of a central support 23 on which a plurality of discs 24 made of a porous getter material are fixed. The support 23 is fixed to a flange 25 that closes opening 21 and also fixes the position of the pump. The getter pump may have also other structures, e.g. of the type shown in patents EP 650639 B1, EP 650640 B1 or EP 910106 B1. In FIG. 2 the pump is shown mounted on wall 20 and having the getter structure facing the inside of the chamber, but it is also possible to use an opposite arrangement, i.e. to arrange the getter pump is a small side chamber external to chamber 13 but communicating therewith through opening 21. In this second way it is also possible to provide for the use of a valve for closing aperture 21 and insulating the side chamber from the process chamber when needed, e.g. in order to change the getter pump or to carry out the reactivation treatment thereof.

Figure 3:
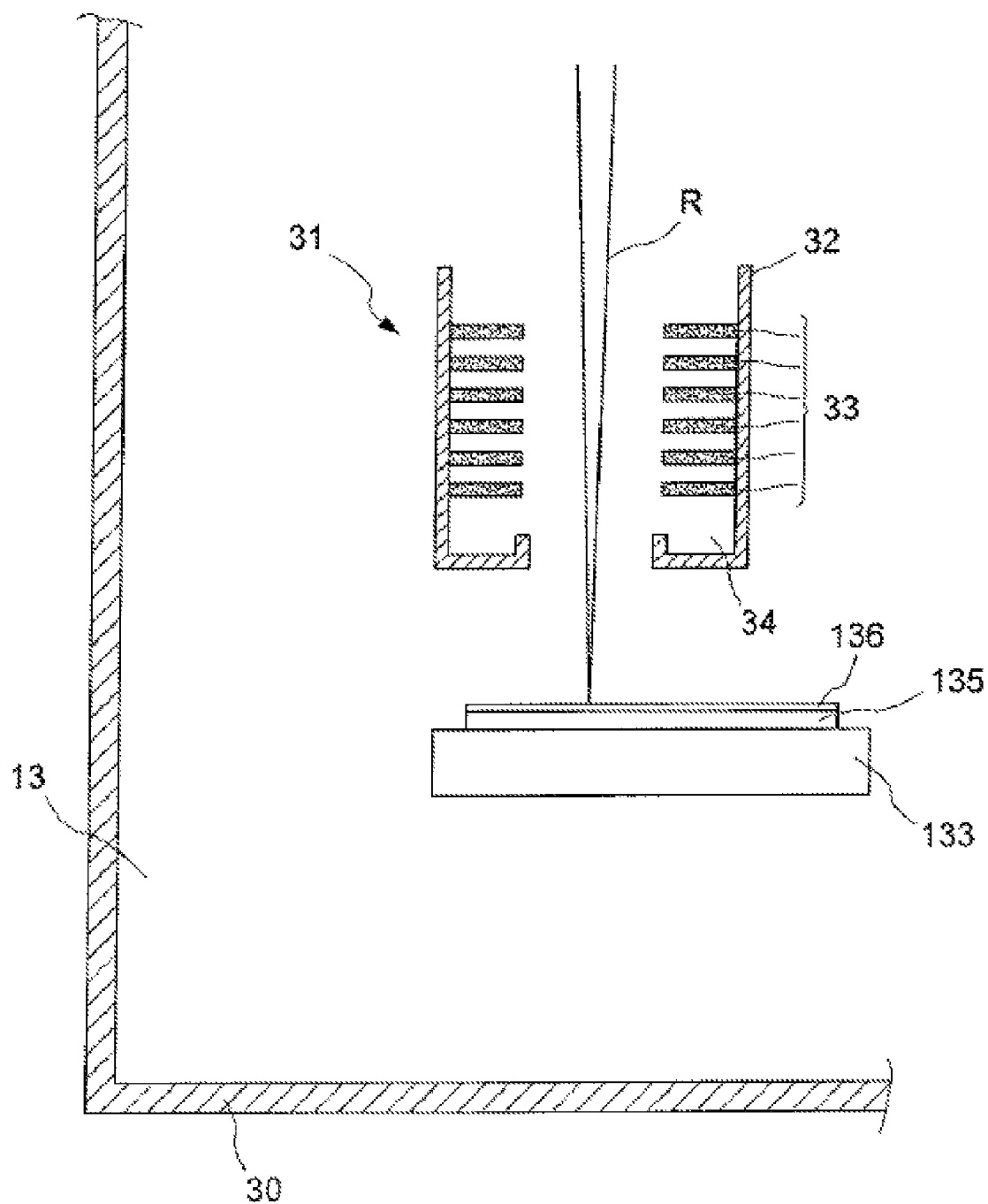
FIG. 3 shows another possibility of positioning a getter member in the process chamber of an EUVL apparatus.

FIG. 3 shows a second possible way to introduce a getter member in the process chamber. Also in this case the getter material is introduced into chamber 13 (defined by a wall 30) in the form of a pump 31. The pump has the shape of a hollow cylinder and is arranged coaxially to radiation R and proximate to the "X-Y" table 133. The pump 31 is comprised of a frame 32 (generally made of metal) and of a plurality of perforated discs 33 made of a porous getter material. The discs are shown simply fixed to frame 32, but it is obviously possible to resort to more elaborated solutions, in which the discs are fixed by means of metal members in order to form a self standing structure inserted in frame 32. In addition the geometry of the getter material members could be different from the one shown and there could be used e.g. a geometry based on radially arranged planar getter members as disclosed in patent EP 650639 B1, a sinusoidal getter member as disclosed in patent EP 918934 B1 or any other suitable geometry for this purpose. Preferably, the lower portion of the frame is so shaped to form a volume 34 adapted to contain possible getter material particles that could detach from the above-standing getter members, in order to avoid that these particles fall onto table 133 or film 136.

The hollow cylinder configuration is a preferred one, although any suitable hollow container may fulfill the same purpose and function.

Finally, FIG. 4 shows a further possible way to introduce a getter member into the process chamber. In this case the sorbing member is comprised of a deposit of getter material on a generally metal surface. FIG. 4 shows a member 41 comprised of a getter material deposit 42 arranged on an inner wall of a hollow body 43, preferably cylindrical-shaped, that is coaxial to radiation R and arranged proximate to the "X-Y" table 133. Also in this case it is possible to provide for shaping the lower portion of body 43 in such a way to form a "drawer" (case not shown in the drawing) in order to retain particles possibly detached from deposit 42, in order to avoid that these particles fall onto table 133 or film 136. However, when deposit 42 is obtained by sputtering it is not necessary to resort to this solution, because the deposits obtained through this technique are generally compact and do not generate particulate.

During the manufacturing steps carried out in the process chamber, getter members and pumps work at room temperature. However, in these conditions only the surface of the getter material is used, the surface being thereby saturated after a certain number of hours of operation and being no longer able to carry out its task. It is thus possible to foresee the presence of heating elements for the getter member or pump (not shown in the drawings) for periodically reactivating the sorbing ability of the getter material, which reactivation may be carried out during the interruptions of the manufacturing process needed for servicing the apparatus.

When such a heating element is present, it may also be used to fix the getter elements of the getter pump, even though advantageous configurations envision the getter elements being disposed around the heating elements without being fixed thereto. A type of these getter pumps is sold by the applicant as CapaciTorr® D2000 MK5 getter pumps.

Suitable getter materials for the invention may be comprised of one single metal chosen among titanium, zirconium, vanadium, niobium or hafnium or may have a composition formed of a number of metals. In the case of a single metal, this is preferably titanium or zirconium. In the case of multimetal materials, these are generally titanium- and/or zirconium-based alloys comprising at least another element chosen among transition elements, rare earths and aluminum, such as Zr—Fe, Zr—Ni, Zr—Al, Zr—V—Fe, Zr—Co-A alloys (where A indicates one or a number of elements chosen among yttrium, lanthanum and rare earths) or Zr—Ti—V alloys.

In order to increase the sorption speed (rate) of the getter material, this is preferably in a form having a high specific surface area (i.e. the surface area of the material for each gram of the same). This condition may be achieved by manufacturing highly porous getter material bodies, e.g. according to the techniques described in patent EP 719609 B1 or in patent application EP 1600232 A1. Alternatively, it is possible to employ getter material deposits formed on suitably shaped surfaces, according to the technique described in patent application EP 1821328 A1 or by sputtering as described in patent EP 906635 B1. When resorting to the deposition of getter material by sputtering, it is possible to increase the surface area of the deposit by forming the deposit on an uneven or rough surface and/or by operating according to the teachings of patent application WO 2006/109343 A2, i.e. under a pressure of noble gas (normally argon) in the sputtering chamber that is higher than the values normally used for the deposition of metal layers, and employing a power applied to the target that is lower than the values normally used in the technique.

The invention claimed is:

1. An extreme UV radiation lithography apparatus comprising
    a vacuum process chamber comprising a support on which a polymeric film is adapted to be located, and
    a Volatile Organic Compounds (VOCs) sorbing member comprising a getter material, the VOCs sorbing member sorbing, in use, organic molecules from the polymeric film upon exposure of the polymeric film to radiation, wherein:
    the getter material is arranged in the vacuum process chamber or in a suitable space connected thereto by way of a suitable opening,
    the VOCs sorbing member is proximate to the support in the vacuum process chamber, and the support is arranged substantially perpendicular to a path of UV radiation impinging, during use, on the polymeric film to locally sensitize the polymeric film, and said VOCs sorbing member is a getter pump having the shape of a hollow container arranged in the vacuum process chamber coaxially to UV radiation and proximate to a polymeric film to be sensitized by the UV radiation.

2. The apparatus according to claim 1, wherein said hollow container is cylindrically shaped.

3. The apparatus according to claim 2, wherein said getter pump is comprised of a cylindrical frame inside which a plurality of perforated discs made of a getter material are present.

4. The apparatus according to claim 2, wherein said getter pump is comprised of a cylindrical frame inside which a plurality of radially arranged planar members made of a getter material are present.

5. The apparatus according to claim 1, wherein said VOCs sorbing member is a deposit of getter material on a metal surface.

6. The apparatus according to claim 1, wherein the getter material is chosen among titanium, zirconium, vanadium, niobium or hafnium, or alloys based on titanium and/or zirconium with at least another element chosen among transition elements, rare earths and aluminum.

7. The apparatus according to claim 6, wherein the alloy is selected from Zr—Fe, Zr—Ni, Zr—V—Fe, Zr—Ti—V, ZrAl, and Zr—Co-A alloys, wherein A is an element selected from the group consisting of yttrium, lanthanum and a rare earth element.

8. The apparatus according to claim 1, further comprising a sample holder configured to hold a mask, the mask having a design adapted to be reproduced on the polymeric film.

9. The apparatus according to claim 1, further comprising an X-Y table on which the support is arranged, the X-Y table being movable by a motorized member and configured to move in a controlled manner in a plane perpendicular to a direction incident to radiation.

10. An extreme UV radiation lithography apparatus comprising
a vacuum process chamber comprising a support, and
a Volatile Organic Compounds (VOCs) sorbing member comprising a getter material, wherein:
the getter material is arranged in the vacuum process chamber or in a suitable space connected thereto by way of a suitable opening, and
the VOCs sorbing member is a getter pump having the shape of a hollow container arranged in the vacuum process chamber coaxially to a path of UV radiation adapted to impinge on the support.

11. The apparatus according to claim 10, wherein said VOCs sorbing member is proximate to a polymeric film to be sensitized by the UV radiation.

12. The apparatus according to claim 10, wherein the getter pump is comprised of a plurality of discs made of a getter material and fixed to a central getter pump support.

13. The apparatus according to claim 10 wherein the getter pump is comprised of i) a plurality of discs made of a getter material and ii) a heating element, wherein said getter discs are fixed to said heating element.

14. An extreme UV radiation lithography apparatus comprising
a vacuum process chamber comprising a support, and
a Volatile Organic Compounds (VOCs) sorbing member comprising a getter material, wherein:
the getter material is arranged in the vacuum process chamber or in a suitable space connected thereto by way of a suitable opening,
the VOCs sorbing member is proximate to the support in the vacuum process-chamber, and
the VOCs sorbing member is a getter pump having the shape of a hollow container arranged in the vacuum process chamber coaxially to UV radiation and proximate to a polymeric film to be sensitized by the UV radiation.

15. The apparatus according to claim 14, wherein said hollow container is cylindrically shaped.

16. The apparatus according to claim 14, wherein said getter pump is comprised of a cylindrical frame inside which a plurality of perforated discs made of a getter material are present.

17. The apparatus according to claim 14, wherein said getter pump is comprised of a cylindrical frame inside which a plurality of radially arranged planar members made of a getter material are present.

18. The apparatus according to claim 14, wherein said VOCs sorbing member is a getter pump comprised of a plurality of discs made of a getter material and fixed to a central getter pump support.

19. The apparatus according to claim 14, wherein said VOCs sorbing member is a getter pump comprised of i) a plurality of discs made of a getter material and ii) a heating element, wherein said getter discs are fixed to said heating element.

20. An extreme UV radiation lithography apparatus comprising
a vacuum process chamber comprising a support, and
a Volatile Organic Compounds (VOCs) sorbing member comprising a getter material, wherein:
the getter material is arranged in the vacuum process chamber or in a suitable space connected thereto by way of a suitable opening, and
the VOCs sorbing member
is proximate to the support in the vacuum process chamber,
is a deposit of getter material on a metal surface, and
is comprised of a getter material deposit on an inner wall of a hollow body arranged coaxially to UV radiation and proximate to a polymeric film to be sensitized by the UV radiation.

21. An extreme UV radiation lithography apparatus comprising
a vacuum process chamber comprising a support on which a polymeric film is adapted to be located, and
a Volatile Organic Compounds (VOCs) sorbing member comprising a getter material, the VOCs sorbing member sorbing, in use, organic molecules from the polymeric film upon exposure of the polymeric film to radiation, wherein:
the getter material is arranged in the vacuum process chamber or in a suitable space connected thereto by way of a suitable opening,
the VOCs sorbing member is proximate to the support in the vacuum process chamber, and the support is arranged substantially perpendicular to a path of UV radiation impinging, during use, on the polymeric film to locally sensitize the polymeric film, and
said VOCs sorbing member is a deposit of getter material on a metal surface and is comprised of a getter material deposit on an inner wall of a hollow body arranged coaxially to UV radiation and proximate to a polymeric film to be sensitized by the UV radiation.

* * * * *

UNITED STATES PATENT AND TRADEMARK OFFICE
CERTIFICATE OF CORRECTION

PATENT NO. : 8,399,861 B2  
APPLICATION NO. : 12/812948  
DATED : March 19, 2013  
INVENTOR(S) : Manini et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 106 days.

Signed and Sealed this
First Day of September, 2015

Michelle K. Lee
*Director of the United States Patent and Trademark Office*